United States Patent
Ding et al.

(10) Patent No.: US 7,842,912 B2
(45) Date of Patent: Nov. 30, 2010

(54) CAMERA BASED VISION ALIGNMENT WITH DEVICE GROUP GUIDING FOR SEMICONDUCTOR DEVICE TESTING HANDLERS

(75) Inventors: Kexiang Ken Ding, San Diego, CA (US); Luis Muller, San Diego, CA (US); John Marquez, San Diego, CA (US)

(73) Assignee: Delta Design, Inc., Poway, CA (US)

( * ) Notice: Subject to any disclaimer, the term of this patent is extended or adjusted under 35 U.S.C. 154(b) by 127 days.

(21) Appl. No.: 12/153,779

(22) Filed: May 23, 2008

(65) Prior Publication Data

US 2009/0289206 A1 Nov. 26, 2009

(51) Int. Cl.
*H04N 17/00* (2006.01)
(52) U.S. Cl. .................. 250/222.1; 250/208.1; 348/95; 348/190
(58) Field of Classification Search ................ 250/221, 250/222.1, 208.1; 348/61.92, 95, 180, 190; 414/404; 382/276, 293, 294
See application file for complete search history.

(56) References Cited

U.S. PATENT DOCUMENTS

| | | | |
|---|---|---|---|
| 3,475,805 A | 11/1969 | Rottman | |
| 4,894,343 A | 1/1990 | Tanaka et al. | |
| 5,290,134 A * | 3/1994 | Baba | 414/404 |
| 5,739,525 A * | 4/1998 | Greve | 250/227.11 |
| 6,640,423 B1 | 11/2003 | Johnson et al. | |
| 7,049,577 B2 * | 5/2006 | Muller et al. | 250/221 |
| 7,336,197 B2 * | 2/2008 | Ding et al. | 340/815.45 |
| 7,506,451 B1 * | 3/2009 | Ding et al. | 33/286 |
| 2003/0016352 A1 | 1/2003 | Goldman et al. | |
| 2003/0188997 A1 | 10/2003 | Tan et al. | |
| 2004/0062104 A1 | 4/2004 | Muller et al. | |
| 2004/0165089 A1 | 8/2004 | An | |
| 2004/0201392 A1 | 10/2004 | Kim et al. | |
| 2006/0232436 A1 * | 10/2006 | Ding et al. | 340/815.45 |
| 2007/0080703 A1 | 4/2007 | Ding | |
| 2007/0185676 A1 | 8/2007 | Ding et al. | |
| 2009/0289206 A1 * | 11/2009 | Ding et al. | 250/559.1 |

FOREIGN PATENT DOCUMENTS

| | | |
|---|---|---|
| DE | 41 14 284 A1 | 11/1992 |
| EP | 0 962 777 A2 | 12/1999 |
| EP | 1 455 179 A1 | 9/2004 |
| JP | 61-228638 | 10/1986 |
| JP | 6-201784 | 7/1994 |

OTHER PUBLICATIONS

Office Action issued Nov. 1, 2007, in U.S. Appl. No. 11/525,222, 10 pages.

* cited by examiner

*Primary Examiner*—John R Lee
(74) *Attorney, Agent, or Firm*—Foley & Lardner, LLP

(57) ABSTRACT

A vision alignment system and method is provided. The vision alignment system includes one or more grouped alignment plates with guiding inserts configured to receive multiple devices, and groups of three actuators, configured to actuate the alignment plates to correct the position offsets of multiple devices as a group. The position offsets between the device and contactor are determined by a device-view camera during runtime and a contactor-view camera during calibration time. The vision alignment system also includes a pick-and-place handler, configured to transport devices.

9 Claims, 4 Drawing Sheets

VIEW FROM BOTTOM
(DEVICE VIEW CAMERA)

VIEW FROM TOP
(CONTACTOR VIEW CAMERA)

CAMERA BASED VISION ALIGNMENT WITH DEVICE GROUP GUIDING FOR SEMICONDUCTOR DEVICE TESTING HANDLERS

CROSS-REFERENCE TO RELATED PATENT APPLICATIONS

U.S. Provisional Patent Application No. 60/719,614 filed Sep. 23, 2005, and U.S. patent application Ser. No. 11/525,222 filed Sep. 22, 2006, are incorporated herein by reference in their entirety.

FIELD OF INVENTION

The present invention relates generally to a device testing and handling system and more particularly to a camera based vision alignment system.

BACKGROUND OF THE INVENTION

The following description of the background of the invention is provided simply as an aid in understanding the invention and is not admitted to describe or constitute prior art to the invention.

Semiconductor devices are commonly tested using specialized processing equipment. The processing equipment may be used to identify defective products and other various characteristics related to the performance of such devices. In most cases, the processing equipment possesses mechanisms for handling devices under test. In order to insure accurate testing, handling mechanisms must be able to correctly align the device under test with various other testing tools and equipment. Correct alignment of the devices is essential for efficient testing.

Various systems are used to position and align devices for testing, sorting and other functions. Generally, alignment is achieved using a mechanical alignment system. However, mechanical alignment is only accurate within certain manufacturing ranges and is not ideal for precise alignment operations. Further, modern devices with finer pitches are driving the need for optically assisted, or vision alignment as an alternative to mechanical alignment.

Accordingly, conventional vision alignment systems used for aligning devices in a two dimensional coordinate system need to use the three axis motion control of an actuator set to align one device to a contactor in x, y and theta (rotation angle) direction.

Accordingly, each device is aligned independently by a set of actuators. However, for a test handler used to simultaneously test an increased number of devices, there is typically no space to put more actuator sets to align each device individually. Additionally, increasing the number of actuators also dramatically increases the system cost.

Therefore, an alignment system is needed that is configured with a common set of actuators that is designed to employ simple cost-effective procedures to align multiple devices. Further, an alignment system is needed that is capable of aligning several devices repeatedly without extensive delay.

SUMMARY OF THE INVENTION

According to one embodiment, a vision alignment system includes a first camera, configured to view the contactor position in a defined alignment coordinate system, a pick-and-place handler, configured to transport a device, a second camera, configured to view the device position in the same predefined alignment coordinate system, a plurality of alignment plates with guiding inserts, configured to receive device cradles and a plurality of actuators, configured to actuate the alignment plates to correct the position offset between the devices and their corresponding contactors.

According to another embodiment, the vision alignment system includes a controller for controlling the operation of the cameras, the pick and place handler, the multiple alignment plate groups and the actuators. The vision alignment system further includes a lighting system configured to provide high contrast lighting for the contactor-view camera and the device-view camera and a vision alignment processor, having a memory, configured to combine and process image results captured by the cameras in order to determine the correct position offsets of multiple devices under test.

According to still another embodiment of the invention, a method for aligning devices for testing, includes the steps of providing a plurality of devices as a group, determining the position offset of the devices in predefined alignment coordinate systems, wherein the alignment coordinate systems correspond to the positions of the contactors, using a set of actuators to position the plurality of alignment plates so that their individual guiding insert's position corresponds to the predefined alignment coordinate system for that contactor, and mounting each of the plurality of device cradles on the contactors through the positioned guiding inserts.

It is to be understood that both the foregoing general description and the following detailed description are exemplary and explanatory only, and are not restrictive of the invention as claimed.

BRIEF DESCRIPTION OF THE DRAWINGS

Features, aspects and advantages of the present invention will become apparent from the following description, appended claims, and the accompanying exemplary embodiments shown in the drawings, which are briefly described below.

DETAILED DESCRIPTION

Embodiments of the present invention will be described below with reference to the accompanying drawings. It should be understood that the following description is intended to describe exemplary embodiments of the invention, and not to limit the invention.

Figure 1:
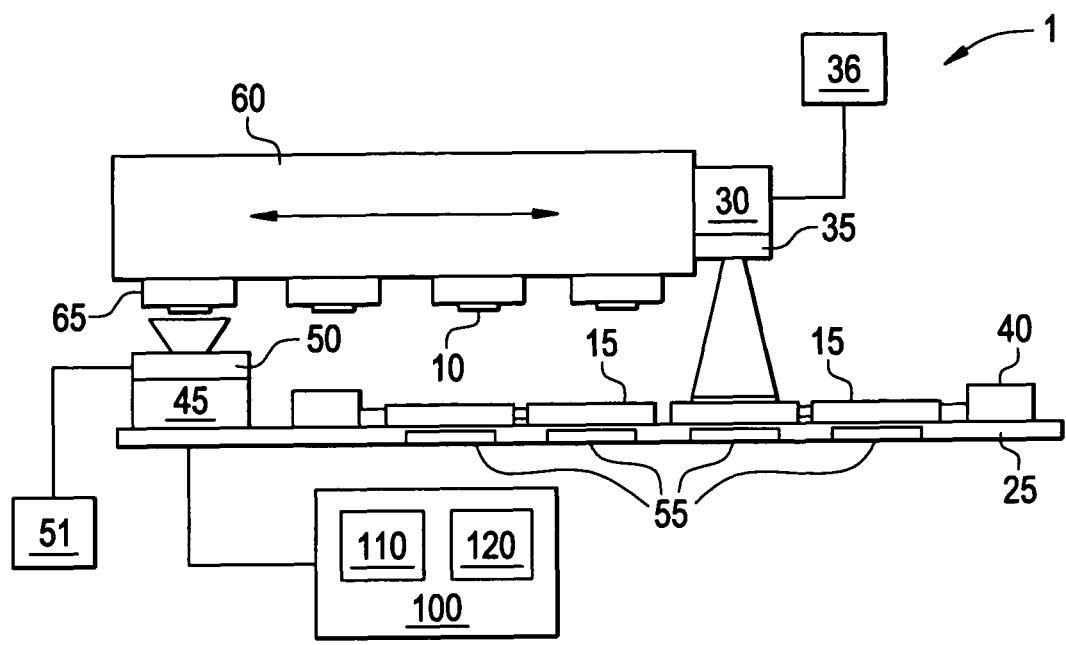
FIG. 1 is a vision based detection and alignment system.
Figure 2:
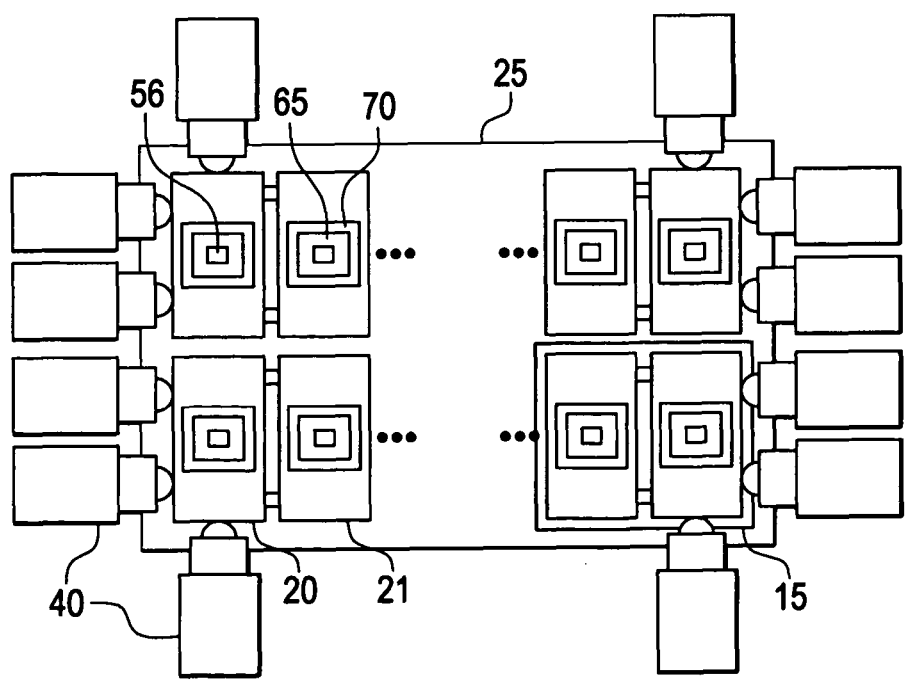
FIG. 2 is a block diagram of a populated contactor plate.

FIG. 1 is a diagram of a vision alignment system 1 for aligning devices 10 for testing. Generally, a device 10 is a semiconductor device (e.g., an integrated circuit). As shown in FIG. 1, one or more devices 10 are transported within the system 1 by a pick-and-place handler 60 and arranged in alignment groups 15 on a contactor plate 25. A plurality of actuators 40 are attached to the active alignment plate 20 (FIG. 2). The alignment groups 15 are positioned above a contacting plate 25. The contacting plate 25 includes one or more contactors 55. A contactor-view camera 30 and contactor-view camera lighting 35 are positioned above the alignment groups 15. The vision alignment system 1 also includes a device-view camera 45 with device-view camera lighting 50 and a controller 100.

According to one embodiment, the controller 100 includes a vision alignment processor 110, having a memory 120 which is configured to interact with the cameras 30, 45, the actuators 40, guide inserts 70 and device cradles 65. The controller 100 is operably connected to all the components in the vision alignment system 1. Accordingly, the controller 100 controls and coordinates all operations that take place related to the vision alignment of the devices 10.

As stated above, the pick and place handler 60 transports devices 10 to various locations within the vision alignment system 1 via device cradles 65. For example, the pick and place handler 60 is configured to initially transport a device 10 from the device-view camera 45 side of the vision alignment system 1 to the contactor-view camera 30 side of the vision alignment system 1 so that the device 10 is aligned and mounted on a contactor 55.

According to one embodiment, one active alignment plate 20 with three actuators 40 for each alignment group 15 is used to correct the horizontal (x), vertical (y) and angle offsets (theta) between each device 10 in that alignment group 15 and the corresponding contactors 55 on the contacting plate 25.

As shown in FIG. 2, the alignment group 15 has one active alignment plate 20 and at least one passive alignment plate 21 in addition to their corresponding device cradles 65 for identifying the correct location 56 of the contactor 55. Each device cradle 65 plunges through a guiding insert 70 for aligning a device 10 in relation to the contactor 55 (shown in FIG. 3) location.

Figure 3:
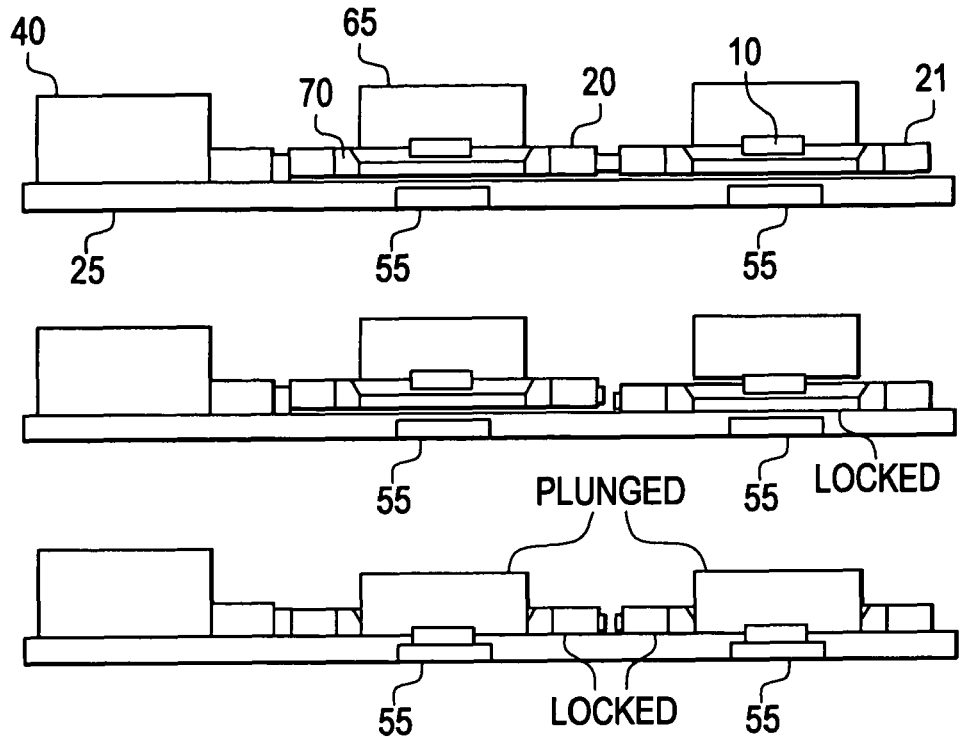
FIG. 3 is a series of section views of an alignment group undergoing the process of aligning and locking to the contacting plate.

During alignment of a device 10, each device cradle 65 is engaged to a positioned and locked to alignment plate 20, 21 as shown in FIG. 3. According to one embodiment, guiding inserts 70 are used to fix a device cradle 65, having spring biased guiding features, to an alignment plate 20, 21. The amount the device 10 is actuated for alignment is based on the amount the device 10 and contactor 55 offset. The offset amount is detected by the device-view camera 45 and the contactor-view camera 30. The offset amount is corrected using the actuators 40 to control the passive alignment plate 21 through its connection to the active alignment plate 20. After the passive alignment plate 21 is aligned to correct for the positional offset, it is locked into position on the contacting plate 25 and released from the active alignment plate 20. The active alignment plate 21 is then aligned for its own device's 10 offset using a similar approach with its respective transform. The device cradles 65 are subsequently plunged through the offset-prepared alignment group 15 so that the devices 10 come in direct contact with the contactor 55 as shown in FIG. 3.

As shown in FIG. 2, three actuators 40 are coupled to the active alignment plate 20. The actuators 40 indirectly adjust the orientation of the device cradles 65 so that the devices 10 will be correctly aligned with a contactor 55 as they pass through the guiding inserts 70. According to one embodiment of the invention, each alignment group 15 has three actuators 40 to correct offsets in an x, y and angular direction.

One actuator 40 is for x correction, the second actuator 40 is for y correction and the third actuator 40 is for angle correction. The system 1 aligns the devices 10 to one contactor 55 at a time even though the actuators 40 may cause more than one alignment plate 20, 21 to be moved during the alignment procedure.

As stated above, the amount the actuators 40 move an alignment plate 20, 21 so that it is aligned with a contactor 65 depends on the positional offset detected by the device-view camera 45 and the contactor-view camera 30. The three-point vision alignment approach used by the system is described in further detail in co-pending U.S. patent application Ser. No. 11/525,222, filed Sep. 22, 2006, incorporated herein by reference in its entirety.

Figure 4:
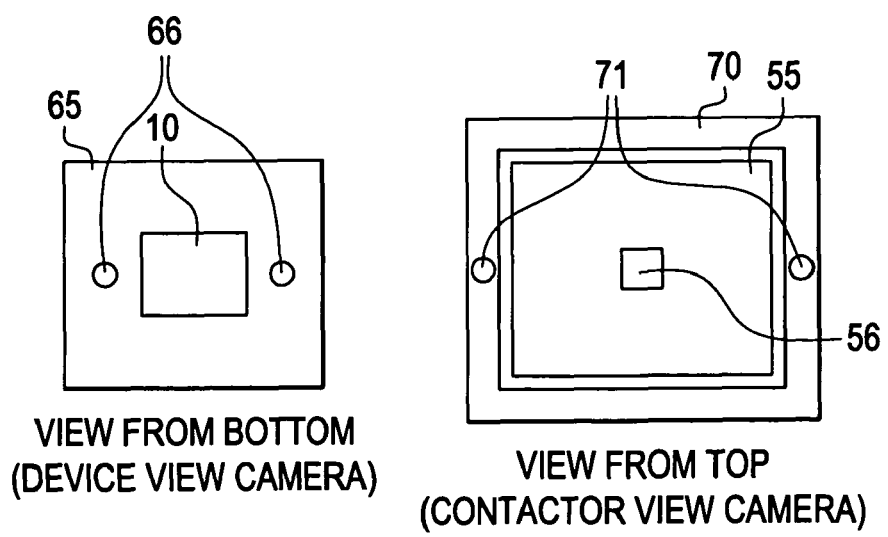
FIG. 4 is an example of fiducial markers located on the guiding inserts and device cradles which are used for imaging and calibration.

FIG. 4 shows a floating device cradle 65 disengaged from the alignment plate 20, 21 during positioning. A film layer of air between the alignment plates 20, 21 and the contacting plate 25 is generated to freely position the alignment plates 20, 21 while remaining suitable for creating and sustaining a vacuum lock (shown in FIG. 3) between the contactor plate 25 and the alignment plates 20, 21. Once positioned and locked to the contactor plate 25, the alignment plates 20, 21 can accept plunged device cradles 65 so that the device 10 mates with the contactor 55.

One or more contactors 55 may be mounted on a contactor plate 25. Each contactor 55 is associated with a nest cradle 65 with guiding features. These features are for locating the device 10 in x and y directions and correcting the angle of the device 10 to match the contactor 55.

As shown in FIG. 1, a contactor-view camera 30 is positioned above the alignment group 15 and is configured to find the position difference between the contactor 55 and the two insert fiducials 71 on the guiding inserts 70 as well as that between the device 10 and the cradle fiducials 66 on the device cradle 65 (see FIG. 4). The images captured by the contactor-view camera 30 are analyzed by the vision alignment processor 110 which contains a calibrated transform between the insert fiducials 71 and the cradle fiducials 66. The vision alignment processor 110 is configured to execute vision alignment software which uses the images captured by the contactor-view camera 30 to determine whether the position of a device 10 needs adjustment so that it will mate accurately with a contactor 55. In turn, the guiding insert 70 is actuated using the actuators 40 to correct the position offset so that the device 10 will mate with the contactor 55.

As shown in FIG. 1, contactor-view camera lighting 35 is provided in proximity to the contactor-view camera 30 to provide light for the camera 30. Generally, the contactor-view camera lighting 35 can be any light or configuration of lights that allows for good contrast in images. Preferably, the contactor-view camera lighting 35 is a three-channel programmable LED array light. The contactor-view camera lighting 35 may further comprise a lighting processor 36 which is configured to execute trained vision lighting recipes. These recipes are executed by the contactor-view camera lighting 35 in order to provide lighting according to user desired configurations.

The device-view camera 45 is used to view the condition of a device 10 before it is plunged through an alignment plate 20, 21. In addition, the device-view camera 45 is configured to capture images for the purposes of calibrating the vision alignment system 1.

As shown in FIG. 1, device-view camera lighting 50 is provided in proximity to the device-view camera 45 to provide light for the device-view camera 45. Generally, the device-view camera lighting 50 can be any light or configuration of lights that allows for good contrast in images. Preferably, the device-view camera lighting 50 is a three-channel programmable LED array light. The device-view camera lighting 50 may further comprise a lighting processor 51 which is configured to execute trained vision lighting recipes.

These recipes are executed by the device-view camera lighting 50 in order to provide lighting according to user desired configurations.

Figure 5:
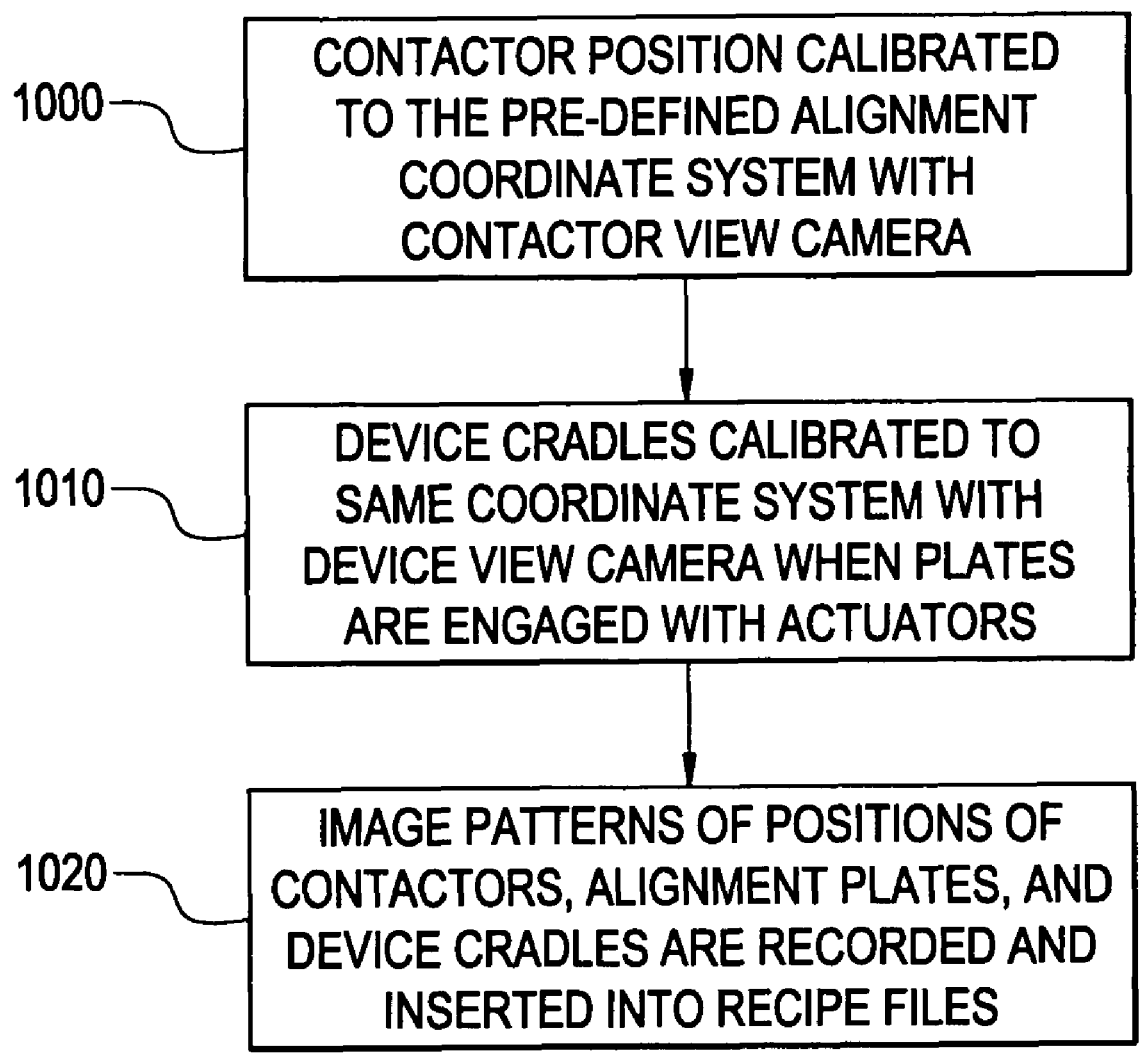
FIG. 5 is a flowchart of the calibration process of the vision alignment system according to one embodiment.
Figure 6:
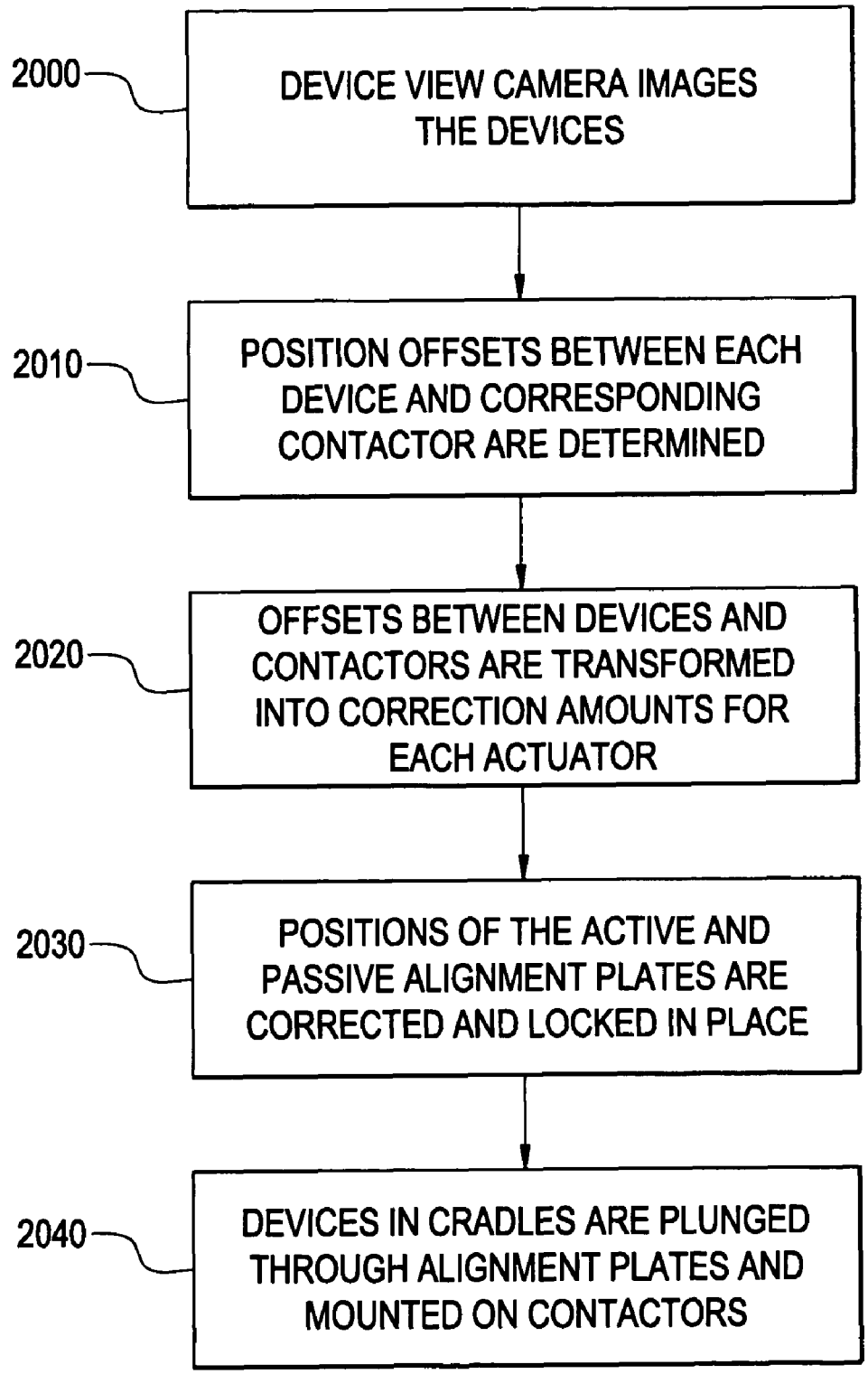
FIG. 6 is a flowchart of the testing process of the vision alignment system according to one embodiment.

Operation of the vision alignment system 1 will now be described with reference to FIGS. 5 and 6. The vision alignment system 1 operates in at least two modes. For example, the vision alignment system 1 is configured to calibrate/train itself and is configured to align devices 10 with a contactor 55.

During the training and calibration phase, a contactor-view camera 30 is used to capture images of the position of each contactor 55 and two insert fiducials 71 on each guiding insert 70—for actuator 40 homing positions (Step 1000). Next, the device-view camera 45 is used to capture images of the positions of a "golden" device and the two cradle fiducials 66 on each device cradle 65 for vision model training (Step 1010). Finally, the vision alignment system 1 records the patterns and positions of the contactors 55, alignment plates 20, 21, devices 10, and actuators 40 to recipe files (Step 1020).

During the runtime phase, first the vision alignment system 1 locates a device 10 in the field of view of a device-view camera 45 (Step 2000). Next, the vision alignment processor 110 uses the calibration information to determine the position difference between the device 10 and the contactor 55 (Step 2010). The position difference between the device 10 and contactor 55 is then communicated and transformed to the position difference of each actuator 40 for the corresponding alignment plate 20, 21 (Step 2020). Accordingly, the actuators 40 adjust the alignment plates 20, 21 so that each device 10 will be correctly aligned with a corresponding contactor 55 (Step 2030). The vision alignment system 1 locks the alignment plates 20, 21 one at a time on the contactor plate 55 before engaging with the device cradles 65 in their individually desired locations.

According to the embodiments described above, several advantages are realized. For example, using vision alignment procedures, the present invention can detect position offsets to a greater degree of detail. In addition, the present invention simplifies the aligning process by using a pre-calibrated system based on a proven trained device. As a result, the complexity involved with alignment procedures are greatly reduced which in turn decreases costs.

Further, this invention provides a universal vision solution to align multiple devices on multiple contactors with the same set of actuators. Moreover, the present invention can be applied across a large number of device handlers, providing a scalable and space-saving solution for testing firms.

The foregoing description of a preferred embodiment of the invention has been presented for purposes of illustration and description. It is not intended to be exhaustive or to limit the invention to the precise form disclosed, and modifications and variations are possible in light of the above teaching or may be acquired from practice of the invention. The embodiment was chosen and described in order to explain the principles of the invention and as a practical application to enable one skilled in the art to utilize the invention in various embodiments and with various modification are suited to the particular use contemplated. It is intended that the scope of the invention be defined by the claims appended hereto and their equivalents.

What is claimed is:

1. A vision alignment system, comprising:
   a first camera, configured to view the position of a plurality of contactors;
   a pick-and-place handler, configured to transport a plurality of devices;
   a second camera, configured to find a position of each device;
   a plurality of alignment plates, configured to receive one or more devices, each having a guiding insert to correct the position offset of the devices; and
   a plurality of actuator sets, configured to actuate the alignment plates.

2. A vision alignment system as claimed in claim 1, wherein each actuator set comprises:
   a first actuator configured to move the device horizontally;
   a second actuator configured to move the device vertically; and
   a third actuator configured to adjust the angular position of the device.

3. A vision alignment system as claimed in claim 2, wherein the alignment plates are grouped with an actuator set, and wherein a film layer of air is positioned between the alignment plates and a contacting plate, the film layer of air configured to freely position the alignment plates over the contacting plate and to create and sustain a vacuum lock between the contactor plate and the alignment plates.

4. A vision alignment system as claimed in claim 1, further comprising:
   a controller for controlling the operation of the first camera, the second camera, the pick and place handler, the alignment plates, the guiding inserts, a plurality of device cradles, and the plurality of actuator sets;
   a lighting system configured to provide high contrast lighting for the first camera and the second camera; and
   a vision alignment processor, having a memory, configured to process images captured by the first and second processor in order to correct a position offset of a device under test.

5. A vision alignment system for a test handler as claimed in claim 4, wherein the lighting system is a three-channel programmable LED array.

6. A vision alignment system for a test handler as claimed in claim 4, wherein a lighting angle of the lighting system is in the range of zero to ninety degrees.

7. A vision alignment system as claimed in claim 4, wherein the vision alignment processor is configured to execute vision alignment software configured to operate the vision alignment system according to desired user settings.

8. A method for calibrating a vision alignment system for a test handler comprising the steps of:
   aligning a training device mounted onto an alignment plate with a contactor;
   recording the position of the alignment plate, the contactor and a plurality of actuators to define the contactor location; and
   transforming the contactor location to an alignment coordinate system for the detection of position offset in images captured by a device-view camera.

9. A method for aligning semiconductor devices for testing, comprising the steps of:
   providing a plurality of semiconductor devices;
   determining a position offset between each of the plurality of semiconductor devices and a defined alignment coordinate system, wherein the alignment coordinate system corresponds to a position of a contactor;
   using a set of actuators to position alignment plates having guiding inserts so that their guiding insert positions correspond to a reference coordinate system; and
   engaging each of the plurality of semiconductor devices with the contactor through the pre-aligned guiding inserts.

* * * * *